United States Patent [19]
Kim et al.

[11] Patent Number: 5,620,511
[45] Date of Patent: Apr. 15, 1997

[54] METHOD FOR PREPARING A PREFORM FOR A COMPOSITE MATERIAL

[75] Inventors: Junsu Kim, Seoul; Bumgoo Chung, Poksan-dong, both of Rep. of Korea

[73] Assignee: Hyundai Motor Company, Seoul, Rep. of Korea

[21] Appl. No.: 563,101

[22] Filed: Nov. 27, 1995

[30] Foreign Application Priority Data

Nov. 28, 1994 [KR] Rep. of Korea .................. 94-31470

[51] Int. Cl.[6] ............................................. C30B 28/00
[52] U.S. Cl. ........................... 117/75; 117/87; 117/921
[58] Field of Search ........................ 117/2, 11, 75, 117/87, 921; 252/299.1

[56] References Cited

U.S. PATENT DOCUMENTS

Re. 34,861  2/1995  Davis et al. ............................ 117/105
4,873,069  10/1989  Weaver et al. ......................... 117/87
4,911,781  3/1990  Fox et al. .............................. 117/75

FOREIGN PATENT DOCUMENTS 4-30448  5/1992  Japan .

*Primary Examiner*—Felisa C. Garrett
*Attorney, Agent, or Firm*—Finnegan, Henderson, Farabow, Garrett & Dunner

[57] ABSTRACT

Disclosed in this invention is a method of preparing a whisker-preform comprising the steps of (a) uniformly dispersing a mixture of silicon microparticles and carbon fibers in the ratio of 4:1 to 8:1 into aluminium alkoxide solution; (b) filtering the dispersion obtained in step (a), dehydrating the filtered material, forming and drying the dehydrated material; and (c) heating the material dried in step (b) at a temperature in the range of 300° to 400° C.

7 Claims, 1 Drawing Sheet

METHOD FOR PREPARING A PREFORM FOR A COMPOSITE MATERIAL

BACKGROUND OF THE INVENTION

1. Field of the Invention

The present invention relates to a method for preparing a preform for a composite material, and specifically, to a whisker-preform for use as a fibrous skeleton in manufacturing whisker-reinforced composite materials which are to be infiltrated or impregnated with matrix materials such as metals, alloys, plastics and the like.

2. Description of the Related Arts

Various whiskers which are composed of a single crystal such as silicon carbide (SiC), alumina ($Al_2O_3$), graphite (C) or silicon nitride ($Si_3N_4$) have a thickness of below 100 μm and a length to diameter ratio of at least 100. The whiskers are mineral fibers of a single crystal, and have high strength, high modulus of elasticity and high heat resistance, and have stable chemical properties. Therefore, usage thereof as a reinforced composite for metals or plastics has been attractive.

For a method for preparing a fiber-reinforced composite using a whisker such as SiC, $Si_3N_4$, $Al_2O_3$, graphite as a reinforced material, a method in which a whisker-preform is first prepared, a matrix material of a molten metal or plastic dissolution is impregnated with a whisker-preform under pressure and then solidified is commonly used. The quality of a composite material prepared by said method largely depends upon texture structure of the whisker-preform to be used.

Recently, as various composite products have been produced on a large scale, and therefore, it has become very important to prepare quickly and finely the whisker-preforms to be used as intermediates.

As conventional method for preparing a whisker-preform, a method for preparing a whisker-preform in which a whisker is dispersed into water or an organic solvent such as alcohol, acetone, ether, and the resulting dispersion is filtered, and the product is formed and dried, is shown in Japanese Patent No. Hei 4-30448. Japanese Patent No. Hei 4-30448 describes that SiC whisker is added to the organic solvent to obtain a concentration of 10 to 60 g/l by mixing with stirring, and uniformly dispersed into the organic solvent, and filtered to remove partially the organic solvent, and subsequently metal powder is added to filtrate, and adjusted to a final concentration of 350 to 1100 g/l, thereafter, the mixture is filtered under suction and molded to obtain the filter cake, and dried. However, the method has following problems.

When the organic solvent is used as a dispersant, carbon particles are produced on the surface of the whisker. Accordingly, when it is complexed with a metal, it gives carbide having very weak bonds thereby decreasing mechanical properties of the composite product.

Moreover, the above method is for preparing a preform composed of a whisker and a single fiber, and it has been difficult to produce a preform having high volume fration because metal particles added are close-packed.

SUMMARY OF THE INVENTION

In order to solve the problems as described above, an object of this invention is to provide a new method for preparing a particle-preform which is applicable to all kinds of globular, without decreasing mechanical properties of the product, and has optionally changeable volume fraction.

In order to achieve the object, the present invention provides a method for preparing a whisker-preform comprising the steps of (a) uniformly dispersing a mixture of silicon microparticles and carbon fibers in the ratio of 4:1 to 8:1 into the aluminium alkoxide solution; (b) filtering the dispersion obtained in step (a); dehydrating the filtered material, forming and drying the dehydrated material; and (c) heating the material dried in step (b) at a temperature in the range of 300° to 400° C. Particularly, the reason why silicon is used is that it does not produce an interface reactant, for a composite material using an Al alloy as a matrix metal. If the microparticle size of silicon is less than 15 μm, close-packing is easily occurred; if its size is more than 60 μm, mechanical strength of the composite is decreased.

Carbon fibers have good self-lubrication that it is advantageous to optionally change volume fraction, and the preferred volume ratio of silicon microparticle to carbon fiber in this invention is 4:1 to 8:1. If the mixing ratio of carbon fiber to silicon microparticle is more than 1/4 volume ratio, it is difficult to show good dispersion of Si particles; if the ratio is below 1/8 volume ratio, silicon particles are close-packed in a preform.

Preferably, the carbon fiber used in the present invention has a diameter of 5 to 15 μm and a length of 1 to 4 mm. If the diameter and length of carbon fiber are out of the above ranges, silicon particles are non-uniformly dispersed.

In the present invention, an aluminium alkoxide compound can be used as an agent for binding silicon particles to carbon fiber.

The aluminium alkoxide compound is dissolved in a hydrophillic solvent to be hydrolysed under acidic condition as follows.

$$Al(OR)_3 + H_2O \rightarrow Al(OR)_2OH + ROH\uparrow \quad (1)$$

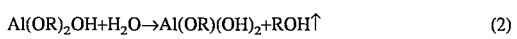

$$Al(OR)_2OH + H_2O \rightarrow Al(OR)(OH)_2 + ROH\uparrow \quad (2)$$

The alcohol compound produced as a by-product, when the aluminium alkoxide compound has been hydrolysed, can be removed during the steps of drying and pre-heating described below.

In this invention, the number of carbon atoms of alkoxide group in the aluminium alkoxide compound is not limited, however, 1 to 4 carbon atoms are preferred in order to easily prepare an aluminium alkoxide having good solubility to water and to easily remove the aluminium alkoxide during the steps of drying and pre-heating. The more preferred aluminium alkoxide compound useful in the present invention is trimethoxy aluminium, triethoxy aluminium, tripropoxy aluminium, or tributhoxy aluminium compound.

Furthermore, the mole ratio of aluminium alkoxide to solvent in this invention is in the range of 0.05:50 to 0.3:50.

The aluminium alkoxide compound is hydrolysed by an acid catalyst.

The amount of an acid catalyst to be added is 10 mole % based on that of aluminium alkoxide. If the amount is below 5 mole %, reaction rate of hydrolysis is slow and the step is delayed; if the amount is more than 10 mole %, an inorganic salt is produced and undesirable reactions are progressed.

A more preferred acid catalyst to be used is HCl having no oxidation ability.

As described above, aluminium alkoxide compound is hydrolysed under acidic condition to obtain an aluminium alkoxide dehydrate compound, which then improves dispersion to silicon microparticles and carbon fibers added.

The addition of silicon microparticles and particles of carbon fiber to aluminium alkoxide solution uniformly disperse whisker particles into the aluminium alkoxide solution using a conventional dispersing method.

The silicon particles and carbon fiber particles uniformly dispersed in the aluminium alkoxide solution are filtered under vacuum to obtain filter cake containing uniformly dispersed whisker particles therein.

Thus obtained filter cake is introduced into the mold and then cast to a form at a pressure of about 5 kg/cm².

When the form is heated at a temperature in the range of 300° to 400° C., polycondensation of aluminium alkoxide compound which is contained in the form occurs, and simultaneously, ROH, a by-product produced during hydrolysis of aluminium alkoxide compound, is removed. The reaction scheme is as follows:

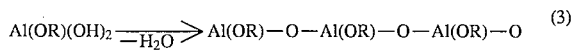

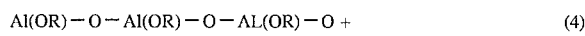

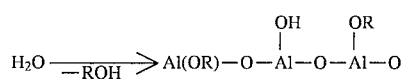

As heating time is increased, $Al_2O_3$ having a bond structure in the form of matrix is produced as shown below.

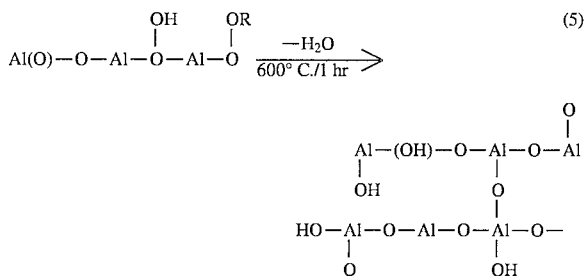

As $Al_2O_3$ is produced, bonding power therefrom occurs, so that whisker-preform having strong bonds is obtained. $Al_2O_3$ which is a kind of whisker as described above does not have an effect on mechanical properties of a whisker-preform. Furthermore, heating temperature is from 300° to 400° C., and excessive corrosion on the surface of Si particles does not occur.

In this invention, the added amount of the whisker to aluminium alkoxide is preferably from 100 to 200 g per mole of aluminium alkoxide. If the amount of the whisker to be added is less than 100 g per mole of aluminium alkoxide, properties of the whisker tend to follow those of $Al_2O_3$; if the amount to be added is more than 200 g, it is difficult to prepare a homogeneous cake.

DETAILED DESCRIPTION OF THE EMBODIMENTS

Figure 1:
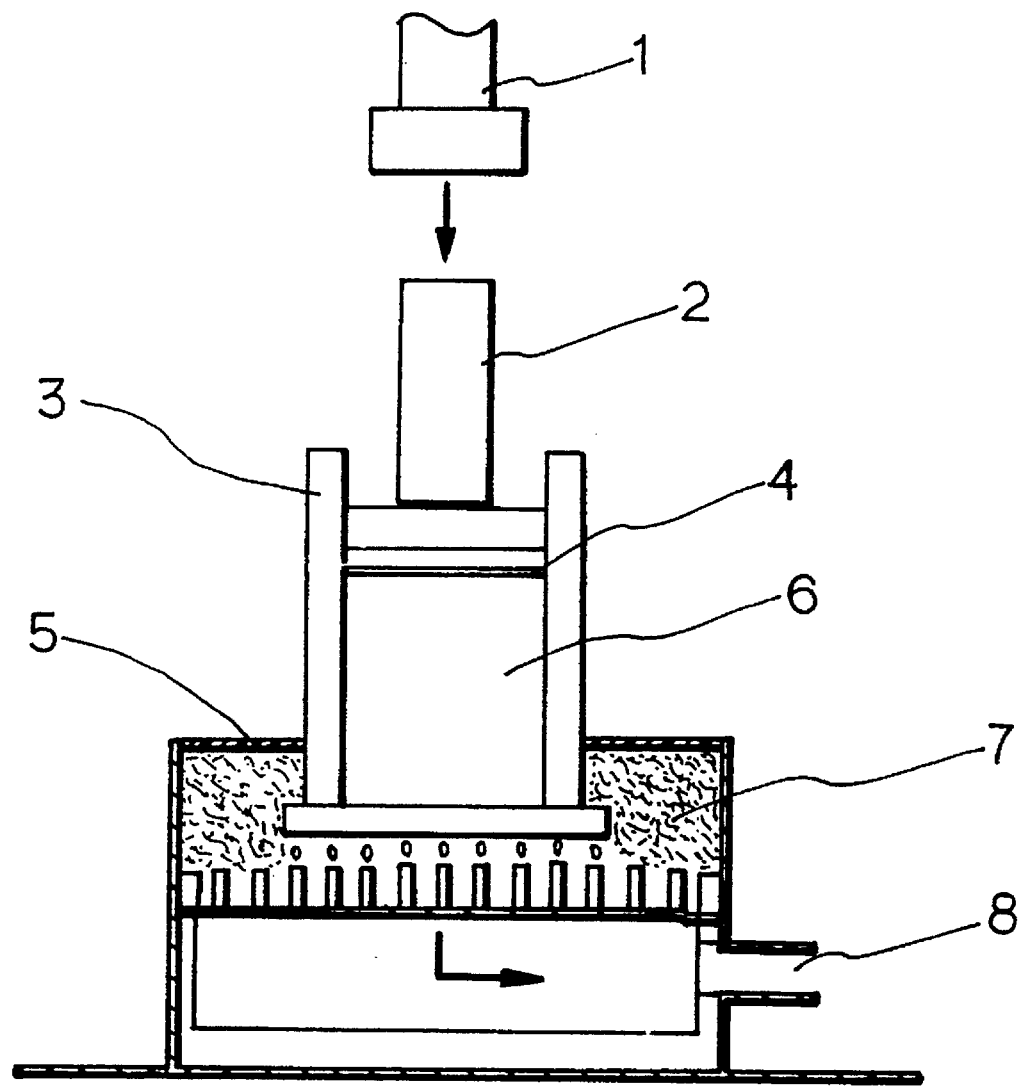
FIG. 1 is a schematic diagram showing an apparatus for preparing the preform.

The present invention is further explained in more details with reference to the following example, which does not necessarily limit this invention.

EXAMPLE 1

Silicon microparticles of a diameter of 30 μm and carbon fibers of 2 mm long and a diameter of 15 μm were mixed with volume ratio of 6:1 to prepare a mixture, and the mixture was added to the aluminium alkoxide solution containing tributhoxy aluminium and ethanol with mole ratio of 0.1:50 so as to obtain a mixture containing 100 g of the silicon microparticles and carbon fibers per mole of aluminium alkoxide. Thereafter, the resultant was uniformly dispersed, and then the dispersion was introduced into a vacuum filtration and dehydration apparatus as shown in FIG. 1. Thereafter, the resultant was filtered, poured into dies for molding, compressed at a pressure of 5 kg/cm², and then the compressed material was heated at a temperature of 300° C. for 90 minutes to prepare a preform for a composite.

COMPARATIVE EXAMPLE 100 g of silicon particles of a diameter of 30 μm was dispersed into 1 l of distilled water to prepare dispersion and 1% of colloidal silica as an inorganic binder was added to the dispersion. The mixture was then shaken at about 2000 rpm for 2 minutes to prepare a suspension. The suspension was introduced into the vacuum filtration and dehydration apparatus as shown in FIG. 1 and the suspension was filtered under vacuum. At the same time, the resulting material was molded at a pressure of 5 kg/cm² to wet-preform, which was released from the mold. Thereafter, the wet-preform was pre-dried at a temperature of 100° C. for 12 hours, and then heated at a temperature of 900° C. for 1 hour to prepare a preform.

The mechanical characteristics of preforms for composites obtained in the above example and comparative example were tested by the following method and the results are shown in Tables 1–3.

A METHOD OF ESTIMATION

We examined the product in the preform using XRD and refraction strength of the preform by triple-refraction test using preform of size of 30×30×100 mm. The molten metal was infiltrated into the preform of diameter of 50 mm and height of 100 mm using dies for tempering molten metal as shown in FIG. 1 so that a distance of permeation was determined. Permeation test was carried out as follows:

Preform was heated at a temperature of 800° C., introduced into the die for tempering molten metal which was preheated to 300° C. as shown in FIG. 1. Thereafter, AC4B Al alloy heated at a temperature of 830° C. was subjected to a pressure of 100 MPa.

TABLE 1

| | Binder material in preform | |
|---|---|---|
| | Example | Comparative example |
| Binder material | $Al_2O_3$ | $SiO_2$ |

TABLE 2

| | Compression strength of preform | |
|---|---|---|
| | Example | Comparative example |
| Compression strength | 0.46 kg/cm² | 0.85 kg/cm² |

The reflection strength of a pre-form is lower than that of the comparative example, however, strain of the preform did not occur in both example and the comparative example under the same conditions as the above preparation of a composite material. The reflection strength of the preform is required to prevent a strain of preform when the molten metal is to be permeated. If the reflection strength of the preform is more than 0.35 kg/cm$^2$, strain of the preform did not occur.

TABLE 3

| | Binder material of pre-form | |
| --- | --- | --- |
| | Example | Comparative example |
| Distance of permeation (mm) | 50 | 22 |
| Strain of preform | no | cracked |

What is claimed is:

1. A method of preparing a whisker-preform, comprising the steps of:
   (a) uniformly dispersing a mixture of silicon microparticles and carbon fibers in the ratio of 4:1 to 8:1 into an aluminium alkoxide solution;
   (b) filtering the dispersion obtained in step (a), dehydrating the filtered material, forming and drying the dehydrated material; and
   (c) heating the material dried in step (b) at a temperature in the range of 300° to 400° C.

2. The method according to claim 1, wherein the silicon microparticles have a diameter of 15 to 40 μm.

3. The method according to claim 1, wherein the carbon fibers have a diameter of 5 to 20 μm and a length of 1 to 4 mm.

4. The method according to claim 1, wherein the aluminium alkoxide solution is prepared by dissolving aluminium alkoxide in a solvent in the ratio of 0.05 to 0.3 mole of per 50 mole of the solvent.

5. The method according to claim 4, wherein the solvent for aluminium alkoxide solution is water or ethanol.

6. The method according to claim 1, wherein the aluminium alkoxide is selected from a group consisting of trimethoxy aluminum, triethoxy aluminium, tripropoxy aluminium, and tributhoxy aluminium.

7. The method according to claim 1, wherein the heating step is carried out at a temperature in the range of 300° to 400° C. for more than one hour.

* * * * *